(12) United States Patent
Hwang et al.

(10) Patent No.: US 6,200,414 B1
(45) Date of Patent: Mar. 13, 2001

(54) CIRCULATION SYSTEM FOR SUPPLYING CHEMICAL FOR MANUFACTURING SEMICONDUCTOR DEVICES AND CIRCULATING METHOD THEREOF

(75) Inventors: Kyung-seuk Hwang; Gyu-hwan Kwag; Young-hwan Yun, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/294,362

(22) Filed: Apr. 20, 1999

(30) Foreign Application Priority Data

Apr. 20, 1998 (KR) .................................................. 98-14010

(51) Int. Cl.[7] ...................................................... C23F 1/02
(52) U.S. Cl. .......................................... 156/345; 438/745
(58) Field of Search .................................. 438/745, 747, 438/748; 137/563, 564, 565; 165/255, 253, 256; 156/345; 134/10, 43, 104.1, 141, 83, 56

(56) References Cited

U.S. PATENT DOCUMENTS

| | | | |
|---|---|---|---|
| 5,361,787 | * 11/1994 | Miyazaki et al. | ............... 134/104.2 |
| 5,488,964 | * 2/1996 | Murakami et al. | ............... 134/95.3 |
| 5,522,660 | * 6/1996 | O'Dougherty et al. | ............ 366/136 |
| 5,924,794 | * 4/2000 | O'Dougherty et al. | ............ 366/136 |
| 6,050,283 | * 4/2000 | Hoffman et al. | .................... 137/3 |

* cited by examiner

Primary Examiner—Benjamin L. Utech
Assistant Examiner—Duy-Vu Deo
(74) Attorney, Agent, or Firm—Jones Volentine, LLC

(57) ABSTRACT

A circulation system for supplying one or more chemicals, or mixtures thereof, includes a chemical tank containing the chemical. A chemical supply line is connected at one end to the chemical tank, through which the chemical from the chemical tank is supplied to one of a processing section, for performing a specific semiconductor device fabrication process, and a bypass section, for collecting the chemical while the processing section is idle. A supply nozzle, connected to another end of the chemical supply line, is movable between the processing section and the bypass section, such that the supply nozzle is selectively oriented above one of the processing section and the bypass section. A primary chemical re-circulation line connects the processing section and the chemical tank, and a chemical bypass line connects the bypass section and a portion of the primary chemical re-circulation line.

11 Claims, 3 Drawing Sheets

CIRCULATION SYSTEM FOR SUPPLYING CHEMICAL FOR MANUFACTURING SEMICONDUCTOR DEVICES AND CIRCULATING METHOD THEREOF

BACKGROUND OF THE INVENTION

1. Field of the Invention

The present invention relates to a circulation system for supplying chemicals for manufacturing semiconductor devices and a circulating method thereof, and more particularly, to a circulation system and a circulating method for supplying and re-circulating chemicals to a processing section for manufacturing semiconductor devices, and a bypass section for collecting the chemicals while the processing section is idle.

2. Description of the Related Art

In general, a silicon substrate passes through many fabrication steps in order to form semiconductor devices thereon. These fabrication steps utilize various types of chemicals for cleaning and etching procedures that are performed during the steps. For example, a wet-etch process is performed on the semiconductor substrate having specific layers and photoresist patterns formed thereon, in which a chemical is used to etch portions of the layers to create a desired pattern. The wet-etch process is controlled by a variety of parameters, including the etch rate (the rate that a layer is etched per unit of time), the selectivity ratio (the ratio of the etch rate of the etched layer to the etch rate of its underlying layer over a certain time period), and uniformity of the etching process.

The rate of removal of material in the etch process depends on, among other parameters, the processing time, the temperature of the etching solution, and the composition of the etching solution. The accuracy to which these parameters can be controlled affects the precise amount of material removed. The etching solution can be used at room temperature, but if necessary, it can be heated or cooled in order to improve the etch rate and the efficiency of the etch process.

FIG. 1 is a schematic diagram of a conventional circulation system for supplying chemicals for manufacturing semiconductor devices. The conventional circulation system includes a chemical tank 10 containing a certain amount of etching solution comprised of a mixture of various chemicals. The chemicals are supplied from the chemical tank 10 through a chemical supply line 12 and then to a processing section where a designated manufacturing process will be performed. In this example, the processing section includes a spin chuck 22, which is rotated by the driving force of a motor 26, having a wafer to be etched loaded thereon. A chemical collection container 24 surrounds the spin-chuck 22 and collects the etching solution while the process is being carried out.

The chemical supply line 12 has a supply nozzle 20 attached at a distal end. Also, along the chemical supply line 12 there are provided, in order, a supply pump 14, a heat exchanger 16, and a cut-off valve 18. The length of the chemical supply line 12 from the front end of the heat exchanger 16 to the supply nozzle 20 is 15 m to 17 m. The portion of the chemical supply line 12 passing through the heat exchanger 16 is coil-shaped, such that the etching solution remains in the heat exchanger 16 for an extended time period. In addition, a cooling water supply may be used to further control the temperature of the etching solution passing through the chemical supply line 12.

A chemical re-circulation line 30 branches off the chemical supply line 12 at a point between the heat exchanger 16 and the cut-off valve 18, and connects to a top portion of the chemical tank 10.

A chemical collection line 28 connects the bottom of the chemical collection container 24 to a top portion of the chemical tank 10. A collection pump 29 is disposed along the chemical collection line 28.

In operation, a wafer to be etched is loaded on spin chuck 22 inside the chemical container 24, and a motor 26 is driven so as to rotate the spin chuck 22. Thereafter, supply pump 14 in the chemical supply line 12 is driven, and a certain amount of the etching solution inside the chemical tank 10 is supplied into the heat exchanger 16 via the chemical supply line 12. As the etching solution passes through the coil-shaped chemical supply line 12 in heat exchanger 16, its temperature is changed by the cooling water interacting with the heat exchanger 16.

Notice that a certain amount of the etching solution inside the heat exchanger 16 is re-circulated back to the chemical tank 10 via the chemical re-circulation line 30 by the pumping operation of the supply pump 14.

The remaining etching solution passes from the heat exchanger 16, through the cut-off valve 18, and then through the supply nozzle 20, where it is sprayed over the wafer to be etched while the wafer is rotating on the spin chuck 22. Any excess etching solution from this process is collected and stored inside the chemical collection container 24. The etching solution inside the chemical collection container 24 is re-circulated into the chemical tank 10 via the chemical collection line 28 by operating the collection pump 29 provided on the chemical collection line 28.

When the wafer etching process is completed, the cut-off valve 18 is closed and the rotation of the spin chuck 22 is stopped. A new wafer is then placed on the spin chick 22 and rotated by the motor 26, the cut-off valve 18 is then opened, and a new etching process commences.

While the new wafer is being prepared for etching, any etching solution collected and stored inside the chemical collection container 24 is re-circulated into the chemical tank 10. However, when the cut-off valve 18 is closed, some of the etching solution remains in the chemical supply line 12 between the heat exchanger 16 and the cut-off valve 18, which alters the temperature of the etching solution. When the new wafer is ready for etching and the cut-off valve is opened, the etching solution with the altered temperature is the first to contact the wafer, which could result in a process failure.

In addition, because of the coil-shape of the chemical supply line 12 inside the heat exchanger 16, the length of the chemical supply line 12 from the front end of the heat exchanger 16 to the supply nozzle 20 (15 to 17 m) is so long that the control of the pumping pressure of the etching solution supplied by the supply pump 14 is very difficult, the temperature change of the etching solution while it is passing through the chemical supply line 12 is very large, and the possibility of chemical leaks or contamination is very high.

Another drawback of the conventional system is that a large amount of time is required to re-circulate the etching solution from the heat exchanger 16, through the chemical re-circulation line 30, and into the chemical tank 10, so that the mixture efficiency of various chemicals is decreased and the uniformity of the chemical temperature in the entire circulation line is poor.

SUMMARY OF THE INVENTION

The present invention is directed to a circulation system for supplying chemicals for manufacturing semiconductor devices, and a circulating method thereof, which substantially overcomes one or more of the problems due to the limitations and disadvantages of the related art.

One object of the present invention is to provide a circulation system, and a circulating method thereof, that prevents etching process failures caused by an etching solution encountering unsatisfactory temperature variations between etching processes for successive wafers.

Another object of the present invention is to provide a circulation system, and a circulating method thereof, that effectively controls the pumping pressure of the system, as well as reduces temperature changes and contamination of the etching solution, by shortening the length of the chemical supply line between the chemical tank and the supply nozzle.

A further object of the present invention is to provide a circulation system, and a circulating method thereof, that facilitates mixing of the etching solution comprising a plurality of chemicals inside the chemical tank.

A still further object of the present invention is to provide a circulation system, and a circulating method thereof, that facilitates mixing of the etching solution having a different temperature according to the position inside the chemical circulation line.

To achieve these and other advantages and in accordance with the purpose of the present invention as embodied and broadly described, the circulation system for supplying chemicals for manufacturing semiconductor devices includes a circulation system for supplying one or more chemicals, or mixtures thereof. The system includes a chemical tank containing the chemical. A chemical supply line is connected at one end to the chemical tank, through which the chemical from the chemical tank is supplied to one of a processing section, for performing a specific semiconductor device fabrication process, and a bypass section, for collecting the chemical while the processing section is idle. A supply nozzle, connected to another end of the chemical supply line, is movable between the processing section and the bypass section, such that the supply nozzle is selectively oriented above one of the processing section and the bypass section. A primary chemical re-circulation line connects the processing section and the chemical tank, and a chemical bypass line connects the bypass section and a portion of the primary chemical re-circulation line.

The system further includes a secondary chemical re-circulation line connected at one end to a lower portion of the chemical tank and at another end to an upper portion of the chemical tank, for circulating the chemical within the chemical tank.

In another aspect of the invention, there is provided a method of circulating one or more chemicals, or mixtures thereof, including steps of: (a) providing a semiconductor processing section for carrying out a semiconductor device manufacturing process; (b) providing a bypass section in close proximity to the processing section; (c) flowing a chemical from a chemical tank through a supply nozzle that is movable between the processing section and the bypass section; (d) moving the supply nozzle such that it is oriented directly above the bypass section; (e) mounting a wafer to be processed in the processing section; (f) moving the supply nozzle such that it is oriented directly above the processing section; (g) performing the semiconductor device manufacturing process; (h) moving the supply nozzle such that it is again oriented directly above the bypass section; and (i) unloading the wafer in the processing section.

The flowing step may be continuously performed during the sequence of steps from (d) through (i), or interrupted prior to each of the moving steps (d), (f), and (h), and then resumed after each of the moving steps (d), (f), and (h).

It is to be understood that both the foregoing general description and the following detailed description are exemplary and explanatory and are intended to provide further explanation of the invention as claimed.

DETAILED DESCRIPTION OF THE PREFERRED EMBODIMENTS

Reference will now be made in detail to the preferred embodiments of the present invention, examples of which are illustrated in the accompanying drawings.

Figure 1:
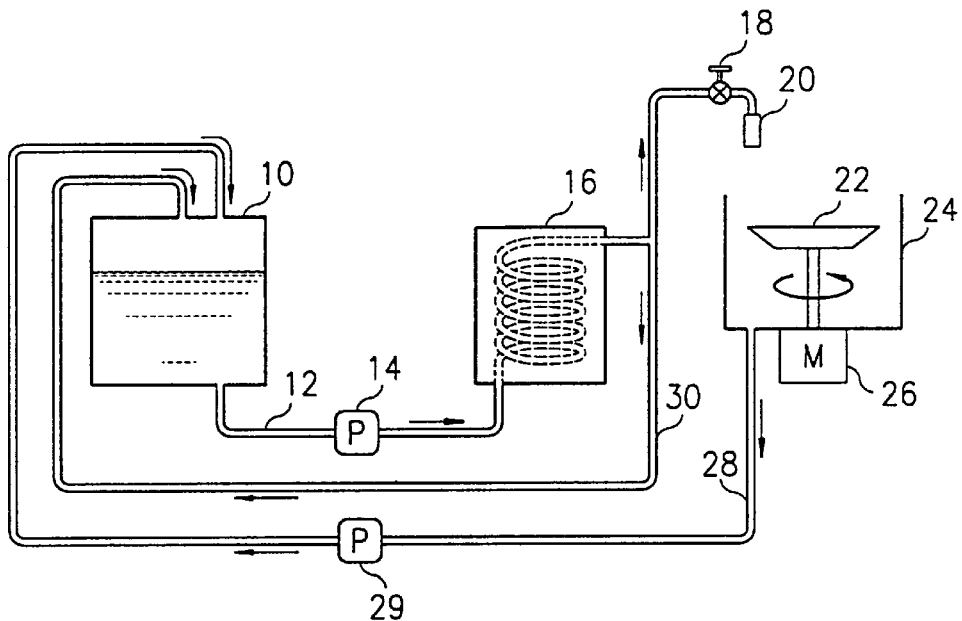
FIG. 1 is a schematic diagram showing a conventional circulation system for supplying chemicals for manufacturing semiconductor devices.
Figure 2:
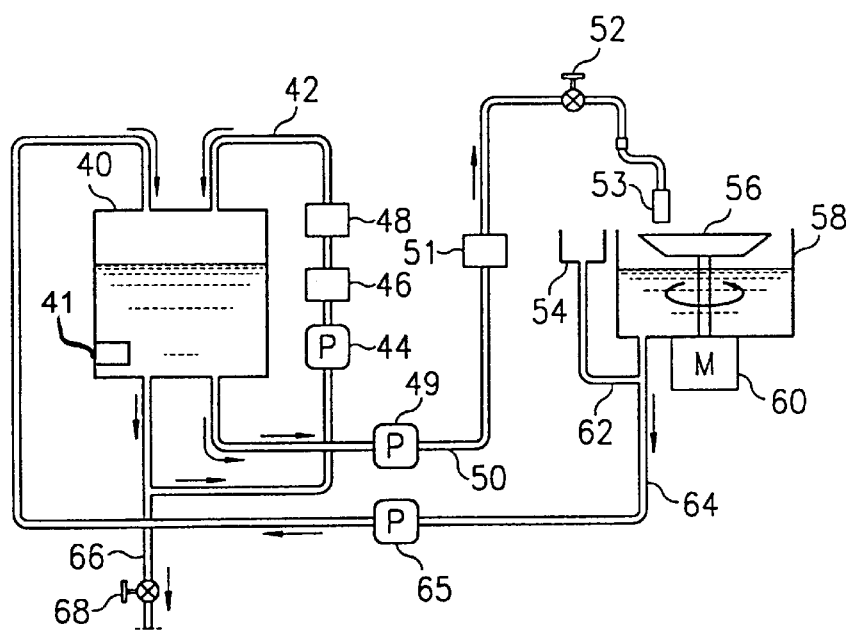
FIG. 2 is a schematic diagram showing a circulation system according to one embodiment of the present invention during a time period when the process is being performed.
Figure 3:
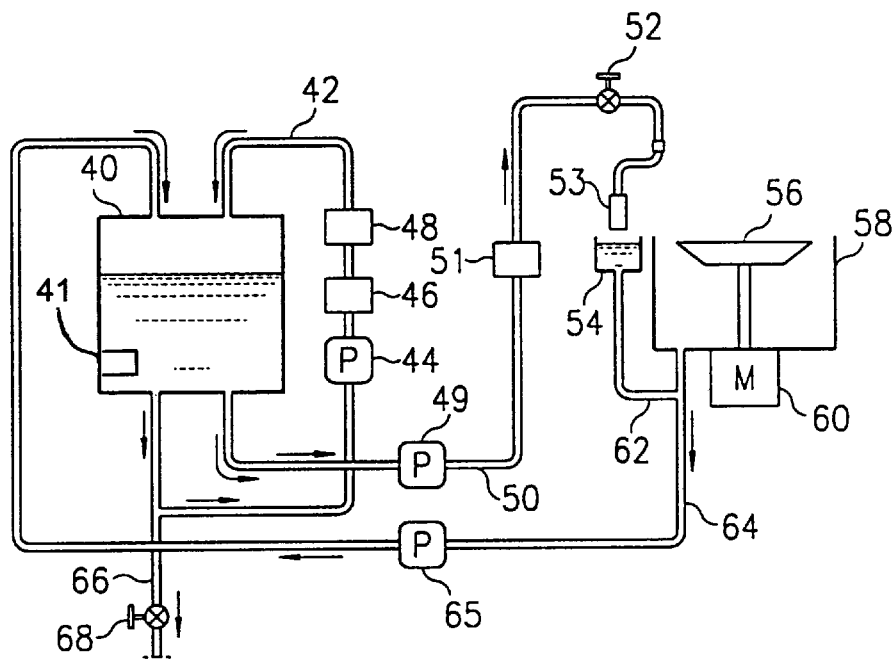
FIG. 3 is a schematic diagram showing a circulation system according to the present invention during a time period when the process is halted while a completed process wafer is removed.

FIG. 2 shows the structure and operation of the chemical circulation system of the present invention as it appears during a semiconductor device fabrication process, and FIG. 3 shows the structure and operation of the chemical circulation of the present invention during a wafer replacement operation.

As shown in FIGS. 2 and 3, the circulation system for supplying chemicals comprises a chemical tank 40 containing an etching solution. While the description below refers to an etching solution, it is understood that the present invention may also utilize other chemicals which are used for different processes, for example, cleaning processes, within the scope of this invention. The etching solution may be any conventional wafer etching solution, for example, a mixture of $HNO_3$ and HF. In this example, the temperature of the etching solution is generally between 35° C. and 42° C. as a result of the chemical reaction between the $HNO_3$ and HF. It is understood that different etching solutions will have different temperatures. A temperature sensor 41 is provided inside the chemical tank 40 for sensing the temperature of the chemicals comprising the etching solution.

Figure 4:
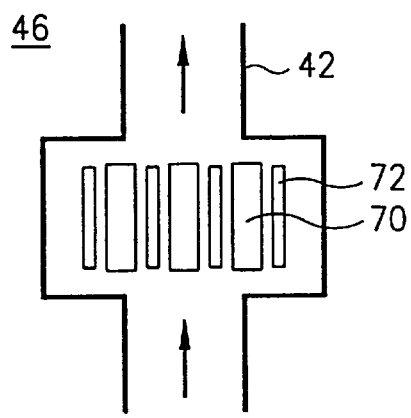
FIG. 4 is a schematic diagram showing the heat exchanger provided on the secondary chemical re-circulation line according to the present invention.

A secondary chemical re-circulation line 42 connects a bottom portion of chemical tank 40 to a top portion of the chemical tank 40 to facilitate the mixing of the chemicals therein. Sequentially disposed along the secondary chemical re-circulation line 42 are a circulation pump 44, a heat exchanger 46, for heating or cooling the passing etching solution according to the information from the temperature sensor 41 in the chemical tank 40, and a filter 48. The heat exchanger 46 may be any suitable heat exchanger. The embodiment of the present invention utilizes the 2R631 model from Komathu Co. in Japan. As shown in FIG. 4, the heat exchanger 46 comprises a plurality of heating plates 70, whose temperature can be changed, and cooling water supply lines 72 disposed between the heating plates 70, through which cooling water at a temperature of 18° C. passes. Accordingly, the etching solution passing through the heat exchanger 46 can be heated by the heating plates 70 or cooled by the cooling water supply lines 72.

A chemical discharge line 66 branches off the secondary chemical recirculation line 42 at a point between the chemical tank 40 and the circulation pump 44, although the exact location of the chemical discharge line 66 can be altered within the scope of the present invention depending in the needs of the facility operator. A discharge valve 68 is provided on the chemical discharge line 66.

A chemical supply line 50 is also connected at one end to the lower portion of the chemical tank 40 and has a supply nozzle 53 fixed to the other distal end. The supply nozzle 53 is movable between a wafer processing section and a bypass section of the present invention, which are described in greater detail later in the specification. Sequentially disposed along the chemical supply line 50 are a supply pump 49, a mass flow controller 51, and a cut-off valve 52. With the configuration of the present invention, the length of the chemical supply line 50 can be 50 cm or less.

In the embodiment shown in FIG. 2, the wafer processing section is used to etch wafers, although it is understood that different processing sections may be used within the scope of the present invention, depending on the particular portion of the semiconductor device manufacturing process that is being performed. In the embodiment of FIG. 2, the processing section comprises a spin chuck 56, which is rotatable by a motor 60, and a first chemical collection container 58 surrounding the spin chuck 56. A wafer to be processed is placed on the spin chuck 58. A lower portion of the first chemical collection container 58 and an upper portion of the chemical tank 40 are connected by a primary chemical re-circulation line 64, which collects the chemicals from the first chemical collection container 58 and re-circulates them to the chemical tank 40. A collection pump 65 is installed along the primary chemical re-circulation line 64 to facilitate re-circulation of the chemicals.

As shown in FIGS. 2 and 3, the supply nozzle 53 is movable between the processing section and the bypass section. The bypass section comprises a second chemical collection container 54, which is connected to the primary chemical re-circulation line 64 via a chemical bypass line 62.

In operation, the pumping operation of the circulation pump 44 on the secondary chemical re-circulation line 42 causes the etching solution inside the chemical tank 40 (existing at a temperature of 35° C. to 42° C.) to be supplied to the heat exchanger 46. The etching solution supplied to the heat exchanger 46 passes through the plurality of heating plates 70, which are spaced apart a certain distance from each other. The etching solution is cooled down to about 23° C. by the cooling water (at approximately 18° C.) flowing through the cooling water supply lines 72.

The etching solution, which was cooled down to 23° C. by the heat exchanger 46, passes through a filter 48 so that contaminants are removed, after which the etching solution flows back into the chemical container 40. This re-circulation of the etching solution is continuously carried out by the pumping operation of the circulation pump 44, while the heat exchanger 46 heats or cools the etching solution according to the information sensed by the temperature sensor 41 inside the chemical tank 40.

In the meantime, a wafer (not shown) to be etched is loaded on the spin chuck 56 of the processing section, and the spin chuck 56 is rotated by the motor 60. The supply nozzle 53 is rotated, by any suitable moving device 57, so that it is oriented over the wafer to be etched.

The supply pump 49 located on the chemical supply line 50 is energized, causing the etching solution to flow from the chemical tank 40, through the cut-off valve 52, and then towards the nozzle 53. The flow of etching solution is controlled by the mass flow controller 51 disposed along the chemical supply line 50.

The etching solution passing through the cut-off valve 52 is sprayed, via the supply nozzle 53, over the wafer mounted on the rotating spin chuck 56 whereby a portion of the wafer is etched by the sprayed etching solution. The etching solution sprayed over the wafer is collected inside the first chemical collection container 58, and is re-circulated back to the chemical tank 40 through the primary chemical re-circulation line 64.

After the etching process for the wafer is completed, the supply nozzle 53 is moved, by the moving device 57, to the bypass section such that the supply nozzle is oriented over the second chemical collection container 54. Accordingly, while the etched wafer is being removed the etching solution sprayed from the supply nozzle 53 is directed toward and stored in the second chemical container 54. This etching solution is re-circulated back to the chemical tank 40 through the chemical bypass line 62 and the primary chemical re-circulation line 64 by the operation of the collection pump 65 provided on the primary chemical re-circulation line 64. While the supply nozzle 53 is rotated between the processing section and the bypass section, the chemical may be continuously supplied, or the chemical supply from the supply nozzle 53 may be stopped and resumed by alternately closing and opening the cut-off valve 52.

During the wafer replacement operation, the motor 60 is stopped and the etched wafer on the spin chuck 56 is unloaded. A new wafer to be etched is loaded on the spin chuck 56, and the spin chuck 56 is rotated by the motor 60. The supply nozzle 53 is rotated back over the spin chuck 56 of the processing section by the moving device 57, and the etching solution sprayed from the supply nozzle 53 contacts the new wafer to be etched on the spin chuck 56 so as to etch a portion of the wafer.

As described above, since the etching solution is re-circulated back to the chemical tank 40 through the chemical bypass line 62 and the primary chemical re-circulation line 64, one can prevent temperature changes of the etching solution remaining inside the chemical supply line 50, which solves one of the problems with the conventional circulation system.

If the composition ratio or the properties of the etching solution of the chemical tank 40 are changed during the process, or if a new chemical process (e.g., a wafer cleaning process) is to be performed, the discharge valve 68 provided on the chemical discharge line 66 is opened so as to discharge the etching solution, and then, a new etching solution (or cleaning solution) is supplied into the chemical tank 40.

Figure 5:
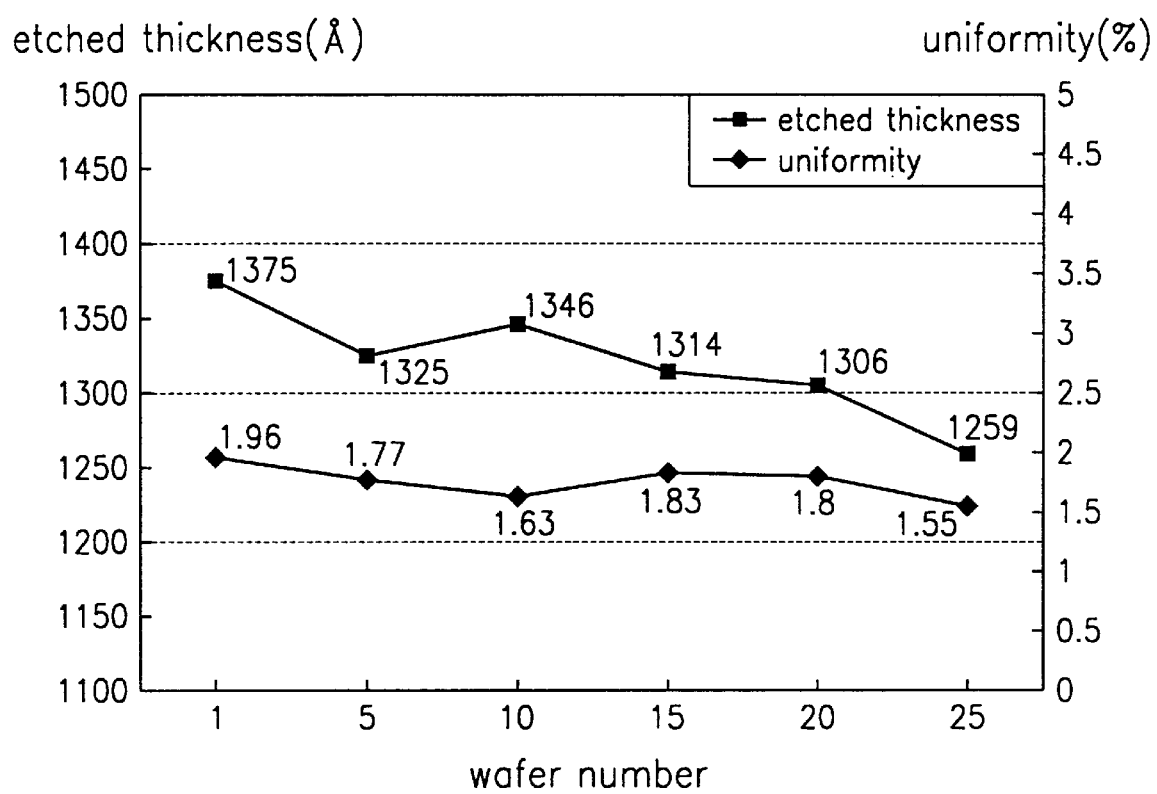
FIG. 5 is a graphical representation showing the etched thickness and the uniformity of wafers measured after sequentially etching 25 wafers using the circulation system and method of the present invention.

FIG. 5 is a graphical representation showing the resulting etch thickness and uniformity of 25 wafers having an oxide film and a polysilicon film formed sequentially thereon, using the circulation system for supplying chemicals for manufacturing semiconductor devices according to the present invention.

As shown in FIG. 5, desirable results can be achieved after performing an etching process using the above-described circulation system of supplying chemicals for manufacturing semiconductor devices. Specifically, the etch thickness for all of the wafers is well within a desirable range from 1200 Å to 1400 Å (first wafer—1375 Å; fifth wafer—1325 Å; tenth wafer—1346 Å; 15th wafer—1314 Å; 20th wafer—1306 Å; and 25th wafer—1259 Å). In addition, the uniformity for all of the wafers is well within a desirable range from 1.25% to 3.75% (first wafer—1.96%; fifth wafer—1.77%; tenth wafer—1.63%; 15th wafer—1.83%; 20th wafer—1.8%; and 25th wafer—1.55%).

Another advantage of the present invention is that the etching solution can be returned to the chemical tank via the chemical bypass line and the primary chemical re-circulation line while the wafer is replaced on the spin chuck, so that the temperature changes of the etching solution, which occurred in the conventional art because the etching solution remained for a certain time inside the chemical supply line, can be prevented, which thus eliminates or reduces etch process failures.

In addition, the temperature changes of the etching solution while its passing through the chemical supply line, and the possibility of chemical contamination or leaks can be reduced or even prevented by providing a shorter chemical supply line, preferably on the order of less than 50 cm.

The secondary chemical re-circulation lines allows the chemicals in the chemical tank to be circulated, thereby preventing etching process failures due to the abnormalities in the etching solution itself.

It will be apparent to those skilled in the art that various modifications and variations of the present invention can be made without departing from the spirit or scope of the invention. Thus, it is intended that the present invention cover the modifications and variations of this invention that come within the scope of the appended claims and their equivalents.

What is claimed is:

1. A circulation system for supplying one or more chemicals, or mixtures thereof, used for manufacturing semiconductor devices, the system comprising:

a chemical tank containing the chemical;

a processing section operative for performing a specific semiconductor device fabrication process using the chemical supplied from the chemical tank;

a bypass section for collecting the chemical while the processing section is idle;

a chemical supply line connected at one end to the chemical tank, through which the chemical from the chemical tank is supplied to one of the processing section and the bypass section;

a supply nozzle connected to another end of the chemical supply line, the supply nozzle being movable between the processing section and the bypass section, such that the supply nozzle is selectively oriented above one of the processing section and the bypass section;

a temperature control system operative to control the temperature of the chemical flowing through the chemical supply line from the chemical tank:

a primary chemical re-circulation line extending from the processing section to the chemical tank, and a pump operatively associated with the primary chemical re-circulation line so as to force fluid in the primary re-circulation line back towards the chemical tank, whereby the chemical supplied into the processing section is returned to the chemical tank; and a chemical bypass line extending from the bypass section to a portion of the primary chemical re-circulation line while bypassing the processing section and thereby connecting the bypass section to the primary re-circulation line such that the chemical supplied into the bypass section from the supply nozzle is returned to the chemical tank, via the chemical bypass line and the primary chemical re-circulation line, whereby the chemical can be made to flow in the chemical supply line while the processing section is idle by directing the chemical to the bypass section so that the portion of the chemical bypassing the processing section and subsequently re-circulated thereto via the primary chemical re-circulation line, the chemical tank and the chemical supply line retains characteristics provided by the temperature control system.

2. The circulation system according to claim 1, wherein the temperature control system includes a secondary chemical re-circulation line connected at one end to a lower portion of the chemical tank and at another end to an upper portion of the chemical tank, for circulating the chemical within the chemical tank.

3. The circulation system according to claim 2, wherein the temperature control system further includes a secondary re-circulation pump and a heat exchanger disposed in the secondary re-circulation line.

4. The circulation system according to claim 3, wherein the temperature control system further includes a temperature sensor installed inside the chemical tank for sensing the temperature of the chemical therein, and wherein the heat exchanger is operative to heat or cool the chemical in response to the temperature information sensed by the temperature sensor.

5. The circulation system according to claim 3, wherein said heat exchanger comprises a cooling water supply line installed in the heat exchanger for cooling the chemical by contacting the chemical.

6. The circulation system according to claim 3, wherein the heat exchanger comprises heating plates for heating the chemical by contacting the chemical.

7. The circulation system according to claim 2, further comprising a filter installed along the secondary chemical re-circulation line and downstream of the heat exchanger.

8. The circulation system according to claim 1, further comprising a supply pump and a mass flow controller installed along the chemical supply line.

9. The circulation system according to claim 1, wherein the processing section is an etching system for etching a wafer placed on a spin chuck.

10. The circulation system according to claim 1, wherein said pump is a primary re-circulation pump disposed in-line along the primary chemical re-circulation line.

11. The circulation system according to claim 1, wherein the bypass section comprises a bypass chemical collection container disposed below the supply nozzle and connected to one end of the chemical bypass line.

* * * * *